US007296201B2

(12) United States Patent
Abramovici

(10) Patent No.: US 7,296,201 B2
(45) Date of Patent: Nov. 13, 2007

(54) METHOD TO LOCATE LOGIC ERRORS AND DEFECTS IN DIGITAL CIRCUITS

(75) Inventor: Miron Abramovici, Berkeley Heights, NJ (US)

(73) Assignee: DAFCA, Inc., Framingham, MA (US)

( * ) Notice: Subject to any disclaimer, the term of this patent is extended or adjusted under 35 U.S.C. 154(b) by 193 days.

(21) Appl. No.: 11/262,084

(22) Filed: Oct. 29, 2005

(65) Prior Publication Data

US 2007/0101216 A1    May 3, 2007

(51) Int. Cl.
    *G01R 31/28*  (2006.01)
(52) U.S. Cl. ..................................... 714/724
(58) Field of Classification Search ............. 714/724, 714/726
    See application file for complete search history.

(56) References Cited

U.S. PATENT DOCUMENTS 6,442,720 B1*  8/2002  Koprowski et al. ......... 714/726
6,836,867 B2* 12/2004  Yonetoku .................... 714/738
7,111,213 B1*  9/2006  Dastidar et al. ............ 714/724

OTHER PUBLICATIONS

Hasteer, G., et al., "An Efficient Assertion Checker for Combinational Properties", Proceedings of the Design Automation Conf., Anaheim, Jun. 9-13, 1997, New York, ACM, vol. Conf. 43, Jun. 9, 1997.

* cited by examiner

*Primary Examiner*—James C. Kerveros
(74) *Attorney, Agent, or Firm*—Henry T. Brendzel

(57) ABSTRACT

When, in the course of an integrated circuit's functional test an assertion fires at clock k, the operational clock is stopped, the sequence is reapplied to capture inputs to the assertion circuit that fired, signals within the assertion circuit are computed, and the error is backtraced. Once one or more inputs of the assertion circuit are identified as potentially the source of the error, the process of backtracing is performed for each such input. When the input that is potentially the source of the error emanates from a memory circuit, the fanin cone of the memory circuit is identified and the process of backtracing through the last-identified fanin cone is undertaken for clock k−1. This is repeated iteratively until either a module of the integrated circuit is found to be the source of the error, or the error is extended to inputs of the SoC.

20 Claims, 2 Drawing Sheets

BOTH OBSERVED AND SIMULATED SIGNAL

BOTH OBSERVED AND SIMULATED SIGNAL

METHOD TO LOCATE LOGIC ERRORS AND DEFECTS IN DIGITAL CIRCUITS

RELATED APPLICATIONS

This invention is related to U.S. patent application Ser. No. 10/425,101, filed Apr. 28, 2003, to U.S. patent application Ser. No. 10/929,709 filed Aug. 30, 2004, to U.S. patent application Ser. No. 10/956,854, filed Oct. 1, 2004, to U.S. patent application Ser. No. 11/051,774 filed Feb. 4, 2005, and to U.S. patent application Ser. No. 11/136,993 filed May 25, 2005, which are hereby incorporated by reference.

FIELD OF THE INVENTION

This invention relates to digital circuits and, more particularly, to functional testing and debugging of integrated circuits (ICs).

BACKGROUND OF THE INVENTION

After an integrated circuit is manufactured, it is typically tested both to check that manufacturing defects are not present in the silicon (manufacturing testing), and to verify that it correctly performs its specified function (functional testing). While manufacturing test is done with a tester, functional testing is typically done "in-system," where the target IC is coupled to other ICs to form a system, and the system is tested with signals that might be expected during the intended use. In general, the input stimuli that the IC receives during such in-system testing are not known in advance and, hence, the expected values of these stimuli cannot be predicted.

In accord with one form of conventional functional testing, different aspects of the IC behavior are checked during its normal at-speed operation, but such testing is typically not automated. Moreover, such testing suffers from the lack of observability of internal IC signals. Assertion checking would be an ideal form of verification for an environment where expected values are not known, because assertions rely on expected relations between signals. However, assertions are not usually implemented in hardware (i.e., built within the IC) because of the high cost of the additional hardware required for a large number of assertions.

In accord with another form of functional testing, diagnostic programs are executed on an embedded processor, in which case the final results out of the IC can be predicted after a sequence of operations.

Once functional testing detects an error, the task that naturally arises next is to locate the root cause of the observed misbehavior. Although integrated circuits are extensively verified before manufacturing, their typically immense complexity often results in logic and timing errors being still discovered in many of the chips tested at-speed in-system. Consequently, a systematic procedure for locating logic errors detected by in-system at-speed functional testing, which is currently not available, is highly desirable.

It is also worth noting that a functional test may fail not because of a logic error but because of a manufacturing defect. Although functional testing is usually preceded by manufacturing testing, manufacturing tests are often not exhaustively complete. Consequently, there may be certain manufacturing defects that escape detection during manufacturing tests. If the functional test detects such a defect, the conventional tester-based diagnosis techniques are not applicable, since it is difficult to reproduce the at-speed functional test on a tester. With in-system testing, on the other hand, a first problem is to determine whether the failure is due to a logic error or to a manufacturing defect. A systematic procedure for locating manufacturing defects detected by in-system functional testing is currently also not available.

The above-mentioned '993 application and the applications to which this '993 relates disclose numerous techniques and advantages of integrated circuits that are constructed with wrapped cores (blocks of the integrated circuit). Specifically, the '101 application discloses a system-on-a-chip (SoC) with configurable wrappers, the '854 and '774 applications disclose assertion checking of SoCs with the use of the configurable wrappers, the '774 and '709 application disclose effectively masking the effects of an error in the SoC by use of the configurable wrapper, and the '993 application discloses a method that enables determining the value of any signal (target signal) in a combinatorial circuit of an SoC that is otherwise unobservable.

When an assertion checking run discovers an error, however, the methods disclosed in the above-identified applications do not identify the particular signal or signals that cause of the error. If discovery of such an error can lead to a correction in the SoC's design then, of course, finding the source of the error (in contradistinction to merely masking its effect) is desirable. It is also desirable to find out whether the error is caused by a manufacturing defect and to locate it, because in such a case there is no need to correct the error, but to enhance the manufacturing test to detect that defect.

SUMMARY OF THE INVENTION

An advance in the art is achieved with a method for locating logic errors or manufacturing defects in ICs subjected to at-speed functional testing. The method backtraces each detected error to a circuit segment of the IC that is the source of the error, or to inputs of the IC. The backtracing can start from any signal where an error is detected by a diagnostic program or any other means, and does not require knowledge of the error-free expected values.

Illustratively, an error is detected in the course of assertion checking with an assertion-checking circuit provisioned within a wrapper of the IC. In the course of the assertion checking, when an assertion fires following a sequence of k clock intervals from a known condition, the operational clock is stopped, the IC is reset, the functional test is reapplied to enable capture of the input signals to the assertion circuit in the prior cycle, signals within the assertion circuit are computed based on the model of the assertion circuit, and the error path is extended towards the captured signals based on the computed signal values and signal values in an error-free situation, which are determined by a line justification algorithm. Typically, the error path will lead to a small subcircuit where the error is generated.

In the context of this disclosure, the process that encompasses the step of stopping the operational clock and the step of extending the error path is referred to as "backtracing." Once one or more inputs of the assertion circuit are identified as potentially the source of the error, the process of backtracing is repeated for each such input. Specifically, when the input that is potentially the source of the error emanates from a combinatorial circuit, a fanin cone for that input is identified and the potential error is extended towards the inputs of the identified fanin cone. When the input that is potentially the source of the error emanates from a memory circuit, the fanin cone of the memory circuit is identified and, recognizing that the output of the last-identified fanin cone is relevant at clock period k−1, the process of backtracing through the last-identified fanin cone is undertaken, iteratively, until either the error is extended to inputs of the IC, or a fanin cone (or an element within the fanin cone) is found to be the source of the error.

DETAILED DESCRIPTION

The principles disclosed herein are applicable to integrated circuits where the values of at least some internal signals can be observed. Since in most ICs all flip-flops have a mode of operation in which they are connected to form shift registers (scan chains), their values can be read by a scan-out operation when the normal operation has been stopped, and therefore, the principles disclosed herein have wide applicability and are of great advantage to the field of IC design, manufacturing, and testing.

At the outset, it is useful to define the notions of a "fanin cone" and a "suspect cone" as used herein. In its simplest form, a "fanin cone" is a single-output circuit that corresponds to that portion of possibly a larger combinatorial circuit (for example, within an IC) that potentially affects the value of that single output. The input signals of a fanin cone are either primary inputs of the IC (whether it is an SoC or not), or output signals of memory elements within the IC. The value of the IC primary inputs can be captured in boundary-scan flip-flops present in most ICs based on the 1149.1 IEEE standard, as described in "Standard Test Access Port and Boundary-Scan Architecture," IEEE Standard P1149.1, 1990. Hence all the input values of a fanin cone can be captured in flip-flops. A "suspect cone" is a fanin cone whose output is erroneous or potentially erroneous, either because the circuitry within the cone causes the error or because an error is applied to the fanin cone via one or more of its inputs.

Figure 1:
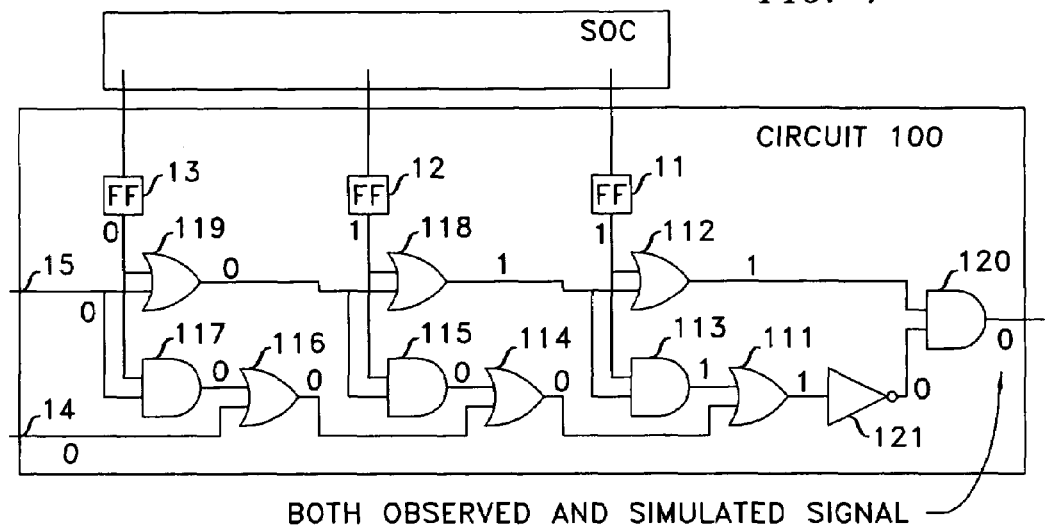
FIG. 1 shows error backtracing through a circuit that propagates an error.

FIG. 1 presents a combinatorial circuit 100 that is a simple realization of a circuit that checks the assertion that one and only one of its inputs is a "1." This assertion-checking circuit may be configured in a wrapper of an IC, but that is not a requirement. The circuit realization in FIG. 1 is such that when the assertion fires (fails) the output of the circuit is a "0." A characteristic of an assertion circuit is that it has one output and a plurality of inputs. An assertion-checking circuit can, therefore, be viewed as a fanin cone, and in the case of the FIG. 1 assertion-checking circuit it is a memory-free (combinatorial) fanin cone.

In the illustrative example of FIG. 1, the values of its input signals (as captured in flip-flops 11, 12, and 13) are "1," "1," "0," respectively, and the observed output of circuit 100, (the output of AND gate 120) in response to these inputs is "0," which suggests that the assertion has fired. It is merely a suggestion, rather than a definitive indication, because one has to make sure that the model of circuit 100 is correct, and that the circuit operates as intended (i.e., contains no manufacturing defects).

Knowing the applied values and the model of the fanin cone, one can simulate the circuit and confirm whether the circuit works properly by comparing the observed output to the simulated output. In the course of this simulation, all of the internal signals of the circuit are also computed. Those simulated values (for the applied input signals) are shown in FIG. 1. In connection with FIG. 1, this process confirms that the circuit operates properly because, as FIG. 1 expressly states, both the observed output of gate 120 is "0" and the simulated output of gate 120 is "0." (In the case of a mismatch between the calculated and the observed values, one is forced to conclude that the error is generated in circuit 100.) Consequently, the conclusion is reached that an error is present in the signals that are applied to circuit 100. The next task is to determine which input or inputs of the circuit 100 present this error.

The assertion represented by the FIG. 1 circuit is extremely simple (that one and only one input is a "1") and therefore it is readily apparent that signals 12 and 13 are potential error signals. The term "potential" is used because although it is known that one of them is definitely in error, it is not known which one. Generally, it is not expected to be easy to identify the error source or potential error sources by mere inspection of the input signals of the suspect cone and, therefore, an algorithmic approach is necessary.

In accord with the principles disclosed herein, the algorithmic approach (when there is just one suspect cone under scrutiny) follows the following steps:

i. Capture all signals that are applied to the suspect cone under scrutiny at the time of the failed output by reapplying the functional test (requiring perhaps resetting the system) that lead to the error.

ii. Calculate the logic values of all signals within the suspect cone under scrutiny based on the captured input signals.

iii. Determine whether the suspect cone under scrutiny operates correctly for the applied values, and if so iv. Extend the error path from the output the suspect cone under scrutiny (which is no longer suspect, in connection with this step is referred to below as the fanin cone) toward the inputs of the fanin cone under scrutiny.

v. Otherwise, conclude that the error is generated in the suspect cone.

In accord with the principles disclosed herein, the step of extending the error path (step iv) involves a comparison of the simulated logic value obtained in step ii to logic values obtained via a line justification algorithm for a situation where the fanin cone under scrutiny propagates an error. That is, if the error condition at clock k of the suspect cone is indicated by S(k) at the output of the fanin cone ("0" in FIG. 1), the output of the error-free fanin cone under scrutiny is $\overline{S}(k)$ ("1" in FIG. 1).

The line justification algorithm is described in Chapter 6 of the textbook "Digital Systems Testing and Testable Design", by M. Abramovici, M. A. Breuer, and A. D. Friedman (published by IEEE Press in 1994). It is a step-by-step process that justifies a signal value by values assigned to its inputs. That is, given a particular value at the output of a sub-circuit or a circuit element, such as a gate, input signal values are assigned that necessarily must exist to force, or justify, the given output value. Initially, all values other than the initial output value of a fanin cone are unknown (unspecified), but as the process is executed value assignments are uniquely determined, or implied, by the values previously assigned, through computations that proceed from outputs to inputs in accordance with specific implication rules. Note that these computations implicitly assume an error-free and a defect-free circuit. When at any point in the process such input values cannot be definitively assigned, it is said that the output value cannot be justified at that point in the process. In connection with AND gates, for example, A "1" output value implies that all inputs have value "1"
When only one input has an unknown value and the other inputs have the value "1," a "0" output value implies that the one input has value "0."
A "0" output value under all other conditions leaves the output unjustified.

Similar rules can be easily derived for the other basic logic gates (OR, NAND, NOR). This process of assigning inputs based on outputs is referred to as backward implication.

When the output signal of a circuit element, such as a gate, is applied to input leads of several subsequent circuit elements, that output is considered to be a stem that branches out to those subsequent circuits. A value on a branch implies that its stem and all the other branches of the stem have the same value. While the value assigned to the stem continues to propagate backwards through the circuit, the values assigned to the other branches (fanout branches) propagate forward, towards of the outputs of the circuit. This process, similar to logic simulation, is referred to as forward implication.

It is possible that following all of the backward and forward implications it still remains that not all outputs of gates are justified. In accord with the principles disclosed herein, when the algorithm encounters such a situation, it:

(1) selects one of the gates with unjustified value to which the error path was extended, and
(2) tentatively assigns a controlling input value to one of the selected gate's inputs whose value is unknown.

A "controlling input value" is a value that dictates the gate's output value independently of the values of the other gate inputs. For AND and NAND gates, the controlling input value is "0", while for OR and NOR gates it is "1".

Choosing the tentative assignment allows the algorithm to proceed with additional steps of backward and forward implications until the algorithm completes, or it makes another tentative assignment to justify another gate whose error value could not be justified by implications.

It should be noted that, following a tentative assignment, an inconsistency may be encountered at some point in the course of the backward and forward implication process. That occurs when one of the assignments that is effectively dictated by the tentative assignment conflicts with a previously assigned value. In such a case the algorithm backtracks to the last decision point and makes a different tentative assignment. The execution of the algorithm thus corresponds to a "depth-first" traversal of the associated decision tree.

Getting back to FIG. 1 where the results of applying steps i and ii are depicted, the circuit simulation based on the circuit's input signals demonstrates that circuit 100 does not generate the error indicated by the "0" at the output of AND gate 120 (step iii). Thus, this circuit is no longer suspect in our search for the reason of the failure of the assertion checked by circuit 100. Comparing those values with their corresponding error-free values as determined by the line justification algorithm, the error path can be extended backwards toward the input of the circuit (fanin cone) under scrutiny.

Proceeding with the line justification algorithm, starting with the fact that the output of gate 120 is a "1" (the error-free situation) leads to the implication that both inputs of gate 120 have the value "1". Addressing gate OR 112, it is observed that its simulated output is "1" whereas its implied value for the error-free situation is also "1." This leads to the conclusion that the error at the output of gate 120 is not presented by the signal of OR gate 120. Also at this point of the line justification algorithm, the "1" output of OR gate 112 does not lead to implications for its inputs because any one of an OR gate's inputs that is a "1" would be a controlling input value. Therefore, the "1" output of OR gate 112 is recorded as unjustified. Addressing inverter 121, the "1" output of gate 121 implied a "0" input, and it follows that the error path extents through inverter 121 to a "0" value at the output of OR gate 111. The "0" at the output of OR gate 111 implies a "0" on both its inputs, and that starts a chain of implications consisting of "0" values at: outputs of AND gate 113 and OR gate 114, outputs of AND gate 115 and OR gate 116, outputs of AND gate 117, and input 14. Since the error-free value of AND gate 113 is "0" but the simulated value is a "1" it is clear that the error is presented by AND gate 113 or, in other words, the error path extends through AND gate 113. The error-free value of OR gate 114 is "0," as is its simulated value, so it is known that the error is not presented by gate 114.

The "0" values at the outputs of AND gates 113, 115, and 117 (in the error-free situation) allow for no implications as to their inputs and so, as in the case of OR gate 112 (discussed above) these signals are marked as unjustified. At this point no more implications can be made.

As indicated above, in accord with the principle disclosed above, a tentative assignment is made of a controlling input value for a gate with an unjustified value whose output indicates an error; in this case, this is gate 113. Illustratively, the tentative assignment is made of a "0" for the input that corresponds to the branch having a stem that extends to the output of OR gate 118 (the lower input of AND gate 113). By the forward implication process, the tentatively assigned "0" justifies the output of AND gate 112, and implies a "0" at one of the inputs of OR gate 112 (the lower input). That allows the previously unjustified output of OR gate 112 to be justified by assigning the controlling value "1" to the other input of OR gate 112, which is extended to the output of flip-flop 11.

The fact that the "0" value at the output of OR gate 118 in the error-free situation, based on the tentative assumption, differs from simulated the "1" value at the output of OR gate 118 indicates that the error path extends to OR gate 118. The "0" output value of OR gate 118 implies that both its inputs have value "0". That is, the "0" of one input extends back to the stem that emanates from the output of OR gate 119, and extends forward to one input of AND gate 115. The "0" of the other input extends back to the stem that connects to the output of flip-flop 12, and extends forward to the other input of AND gate 115. Since the "0" output of flip-flop 12 in the error-free situation does not agree with the simulated "1" output of flip-flop 12, it follows that the error path extends to flip-flop 12. Since both inputs of AND gate 115 are now assigned to "0," the "0" output of AND gate 115 becomes justified.

Lastly, the "0" on the stem emanating from OR gate 119 implies "0" values for the two inputs of gate 119, at the output of flip-flop 13, and at input 15. It is noted that the tentative assignment made resulted in no inconsistencies. Therefore, the conclusion can be reached that the tentative assignment was proper and that the resulting error path extension is also proper. From flip-flop 112, the error path can be further backtraced in the circuit feeding it, but this is not shown in FIG. 1.

While the tentative assignment was proper in the sense that a consistent set of error-free value resulted, and these values allowed the process to reach the conclusion that the error path extends to flip-flop 12, there may be more than one consistent solution. To explore the other solutions, the algorithm reverts to the circuit state as it was prior to the signal value assignments that were made in consequence of the tentative assignment made to the lower input of AND gate 113, and makes a different tentative assignment. Thus, making the tentative assignment of a "0" at the upper input lead of AND gate 113 is an alternative way to justify the output of AND gate 113. This assignment extends to the upper input of OR gate 112, and to the output of flip-flop 11. The "0" value at the upper input of OR gate 112 dictates the assignment of the controlling value "1" at the lower input of OR gate 112 to justify its output value, and this assigned "1" extends to the output of OR gate 118 and to the lower input of AND gate 113.

Since, the observed value of flip-flop 11 is a "1," while its implied error-free value is "0", this results in the conclusion that the error path extends to flip-flop 11. Since the second tentative assignment results in consistent set of error-free values showing an error path extending to flip-flop 11 we have obtained a second solution.

The result of the above is a conclusion that the error path extends to two separate elements: the output of flip-flop 12 and the output of flip-flop 11. These output signals are potentially in error, in the sense that one or the other is in error, but at this point it is not known which. To identify which is the true source of error, the circuits that developed the input signals of circuit 100 need to be investigated.

Figure 2:
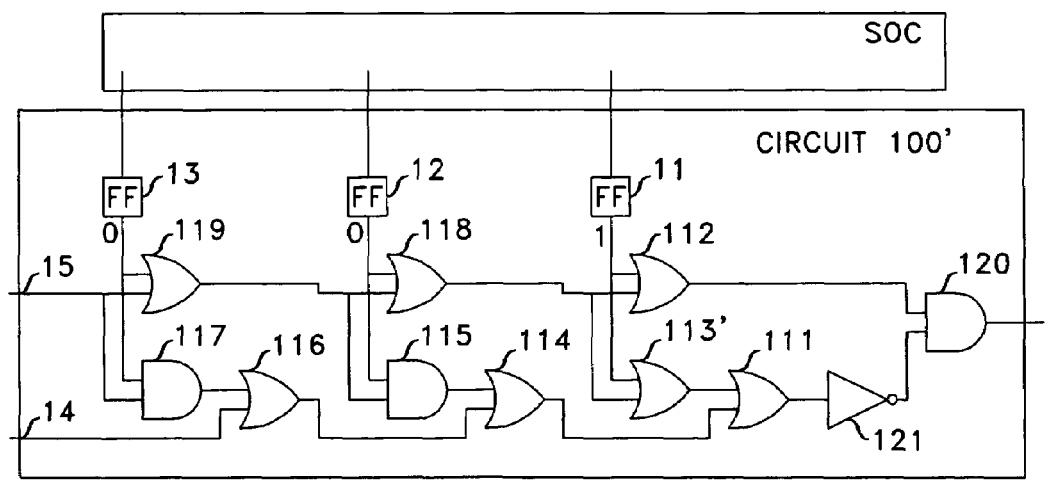
FIG. 2 depicts a version of the FIG. 1 circuit that is logically incorrect in that it has an OR gate (113') where an AND gate should be.

Whereas FIG. 1 illustrates the situation where the fanin cone works properly, FIG. 2 illustrates a situation where the suspect cone (100') is incorrect because, through an error in logic, it was created with an OR gate 113' instead of AND gate 113. The input signals to circuit 100' are "1," "0," and "0" for flip-flops 11, 12, and 13, respectively, and, according to the correct model of the circuit (where gate 113 is an AND), there should be a "1" at the output of circuit 100' because the assertion of "one and only one being a "1" is not violated. However, the "1" of flip-flop 11 causes the output of OR gate 113 to be "1," the output of OR gate 111 to be "1," the output of inverter 121 to be "0," and the output of AND gate 120 to be "0" representing an error. In step iv of the method, a simulation according to the correct model specifies that the output of circuit 100' should be a "1." Since the simulation does not agree with the observed output, the conclusion is reached that circuit 100' does not correspond to the model of the circuit, which indicates that it does not work properly.

While, as indicated above, in some sense the task is complete because the analysis resulted in a conclusion that a particular suspect cone (in this case, circuit 100') is not operating properly, it often is useful to determine the source of the error with more particularity. The error generated within the suspect cone under scrutiny (circuit 100') may be the result of: 1) an actual logic design error within the suspect cone, 2) an incorrect model used to implement the suspect cone, 3) insufficient timing margin for process variations that affect the propagation delays in the suspect cone, 4) a defect that escaped the manufacturing test but was detected by the in-system functional test, or 5) a defect that occurred after the SoC passed the manufacturing test. (The situation at hand corresponds to case 1 or 2.) The fact that there are a number of possible root causes, and overcoming those root causes may suggest different actions demonstrates the usefulness of determining the cause of the error within the failed suspect cone.

Additional experiments may be performed to increase the diagnostic resolution within the cone generating the error. For example, repeating the functional test with different samples of the same IC helps to distinguish between possible causes. For example, if all tested ICs exhibit the same error symptom, then it is likely to have a logic error or an incorrect model (case 1 or 2). If a symptom is particular to only one IC, that IC is likely to have a defect (case 4 or 5). A symptom occurring in several, but not all, ICs indicates that it is likely to have a marginal design (case 3) or a systemic defect. Additional tests may also be applied to a suspect cone, for example, by using the wrapper to produce the required stimuli and/or observe the results, as taught in the aforementioned '101 patent application.

From the above it should be clear that there are no limitations to the above method for backtracing errors in an integrated circuit, except the following:

- the model (presumed design) of the integrated circuit is known;
- somehow it is known that k clock periods following a known condition an observable error arises in the circuit; and
- there are means to stop the operation of the integrated circuit at a particular clock period, and then to observe the values of at least some of the memory elements within the integrated circuit.

The "known condition" mentioned above may be a Reset state of the integrated circuit, or any other condition that is observable, for example, with an event detector circuit configured in a configurable wrapper of the IC that is being tested. Knowledge of the passing of k clock periods from the known condition is inherent in the testing apparatus; for example, it may be a programmable counter within the clock control mechanism of the IC, or a programmable counter configured in a configurable wrapper of the IC; this counter starts on the occurrence of the known condition, and stops the functional clock after the specified number of clock cycles. The means by which it is known that an error arises, which is vehicle for specifying the value of k, may be an assertion-checking circuit, or circuits. By way of example and as indicated above, such circuit or circuits can be created in hardware within the integrated circuit and permanently connected to the functional portion of the integrated circuit, or can be configured in a functionally configurable module that is associated with one or more blocks of integrated circuit; for example, in a wrapper encompassing the one or more blocks.

Based on the above, it is clear that the above-disclosed principles are applicable to in-system functional testing of ICs, which as indicated in the Background section is desirable, and also applicable to IC testing with diagnostic programs. A very advantageous attribute of the principles disclosed herein, which is not available in the prior art, is that knowledge of the expected values is not required.

Figure 3:
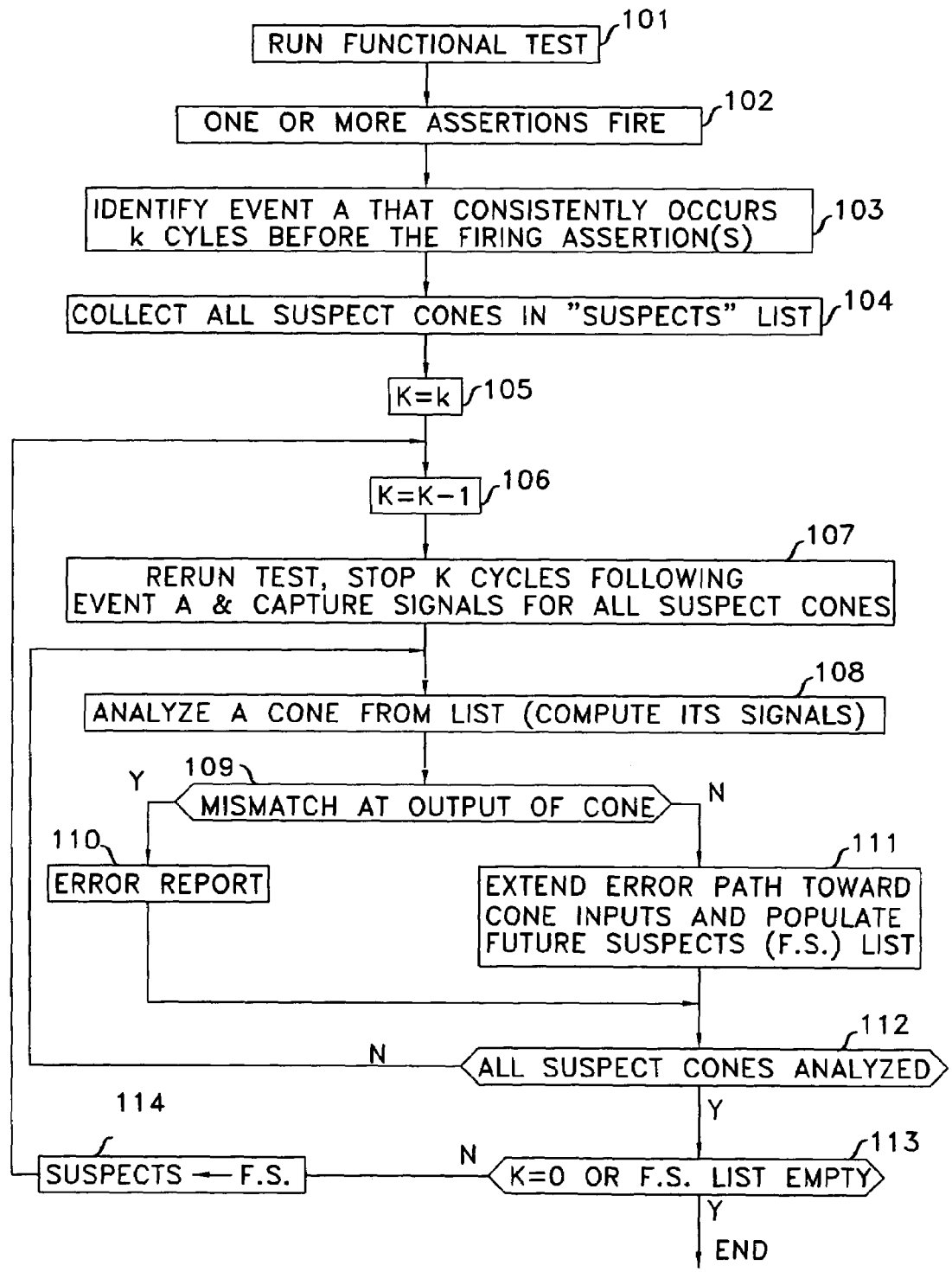
FIG. 3 is a flowchart of the error-location process where the error path is backtraced either to a source of the error or to inputs of the tested integrated circuit.

FIG. 3 presents the above-disclosed method. At step 101 the IC is illustratively run "in system," pursuant to a functional test running at the normal operating speed. An error is detected in the course of running the functional test when one or more of the assertion-checking circuits fire, and this condition is detected in step 102. Control then passes to step 103 where, perhaps offline, an event A is identified in the IC under test that consistently occurs k cycles before the first assertion fires. This may involve an identification of the event A, and a number of repeated runs to both confirm that the error occurs consistently after the occurrence of event A and that the error occurs consistently k cycles after event A.

Detecting event A is may involve the use of sequential circuit, since event A may be a sequence of other events the circuit.

Following step 103, control passes to step 104 where the suspect cones corresponding to the fired assertions are identified and collected in a "Suspects" list, and control passes to step 105, which sets a register K to value k.

Usually, the result of any assertion is registered in a flip-flop, so that the suspect cones identified in step 104 are the cones that feed flip-flops where errors are captured, and the inputs of these suspect cones are set one cycle earlier. Consequently, step 106 decrements register K, and passes control to step 107.

It is noted that this process implicitly assumes defect-free and error-free operation of flip-flops, which is a justified assumption because flip-flop defects are extremely unlikely to escape the manufacturing test, and design errors are assumed to not be present in such a commonly used library element.

Step 107 repeats the functional test, detects event A, counts a number of cycles that corresponds to the value in register K, stops operation and captures the input signals for all of the suspect cones in the "Suspects" list. Control then passes to step 108 which proceeds to analyze the captured signals. Specifically, step 108 selects (and possibly removes) a cone S from the "Suspects" list and computes all of signals of cone S. Control then passes to step 109 which determines whether the computed output signal of suspect cone S (simulated output signal based on the known input signals and the known model of suspect cone S) matches the observed error signal. If there is a mismatch, block 110 reports that cone S generates an error, and control passes to step 112 to determine whether other assertions that fired at clock k stemmed from a different error. If there is no mismatch, control passes to step 111, which initiates a process for extending the error path toward inputs of suspect cone S, and for each of the inputs (of suspect cone S) to which the error path is extended, a suspect cone is identified and placed in a "Future Suspects" list. Control then passes to step 112, which ascertains whether all of the suspect cones in the "Suspects" list were analyzed (if a cone is removed from the "Suspects" list when it is analyzed, then step 112 determines whether the "Suspects" list is empty. If not, control returns to step 108 to select another suspect cone for analysis. Otherwise, control passes to step 113, which determines whether the value in register K is equal to 0 or the "Future Suspects" list is empty. If so, the process terminates.

The above description of the FIG. 3 process assumes that the suspect cones are combinatorial, and that the inputs of the suspect cones come from primary inputs of the tested IC or from internal flip-flops. Relative to those internal flip-flops, they are the outputs of the suspect cones of the "Future Suspects" list, and the error path should be extended to their inputs. Accordingly, when step 113 determines that the value in register K is greater than 0 and the "Future Suspects" list is not empty, control passes to step 114, which transfers suspect cones of the "Future Suspects" list to the "Suspects" list, and returns control to step 106.

If at step 109 there is a mismatch, a conclusion is reached that an error exists in suspect cone S and control passes to step 110 where an appropriate error report is made. That accounts for the fired assertion from which the error path was extended. However, step 102 permits the condition of more than one assertion firing at clock k. In conformance with this permitted condition, control from step 110 proceeds to step 112 in order to pursue investigation of the other firing assertions.

It is recognized that a defect (or incorrect signal condition) might result in more than one assertion firing, and it is quite possible that these assertions would fire at the same clock, k, as well as at different clock cycles. It is also possible that the firing of more than one assertion at a particular clock cycle is due to two different errors, although that is not as likely as such two different errors firing at different clock cycles. Since later errors may be a consequence of earlier ones, it is advisable to investigate the earlier errors before investigating the later errors.

It is noted that the algorithm disclosed in FIG. 3 works breadth-first, as it acquires all of the input signals of the multiplicity of suspect cones concurrently, and then analyzes the operation of all the suspect cones at one clock cycle before repeating the test and stopping one cycle sooner. Alternatively, one can design an algorithm working depth-first, where one error path is extended all the way to event A before another suspect cone is analyzed.

If error paths end at primary inputs of the IC while no suspect cone has been found "guilty" of generating an error, then the algorithm has exposed an input sequence that makes an assertion fire. In such a case the error is generated in the other ICs that drive the IC under test with "illegal" inputs that do not obey the communication protocols between ICs. A typical example is a request-grant-send protocol, where a driving IC is supposed to send data to the receiving IC only after checking that the receiver accepts a request. If the sender IC operates incorrectly sending data without requesting or waiting for approval, this problem can be detected by an assertion failing on the receiver. However, the root cause of the assertion failure is not on the chip where the assertion is implemented. In this case, our algorithm will identify the illegal input sequence applied to the IC under test.

It should be noted that the second condition mentioned above for the applicability of the principles disclosed herein is that somehow it is known that k clock periods following a known condition an observable error arises in the circuit. The question, of course, is how such an error is to be observable. In the illustrative example discussed above, the observable error is obtained by use of assertion checking circuit or circuits, but that implies that inputs signals that are necessary for the assertion checking circuits are also available. With "at speed" functional testing, in contradistinction to "step by step" functional testing, the only signals that are available are those signals that are accessible at the primary inputs (physical terminals) of the IC. This is somewhat limiting. Advantageously, however, in ICs that have reconfigurable wrappers as described in the aforementioned '101 application, and inputs of a wrapped block (a portion of an IC) can serve as inputs of an assertion checking circuit cone (even if they are not primary inputs of the IC), since their values can be captured in flip-flops available in the block's wrapper even with "at speed operation."

Preferably, the number of cycles k separating the event A from the first assertion firing should be large enough so that the error generation (or the application of an illegal input sequence) occurs in the interval between detecting A and detecting the error. Otherwise the algorithm in FIG. 3 may end in step 113 when the value in register K is 0, but when the set of future suspects is not empty, that is, before obtaining a solution. In such a case an earlier A event must be found and the process repeated.

The invention claimed is:

1. A method for testing a circuit when in the course of said testing information is developed that indicates that an error is present in one or more signals $S_{j,l}(k)$, where j is an index that distinguishes different ones of said signals, l is a level indicator that is initially set at 0, and k indicates a number of operational clock periods following a given condition when said error signals appear, said method starting with a variable m equal to k, and comprising the steps of:

for at least one of the signals $S_{j,l}(m)$,
- (a) identifying an associated fanin cone;
- (b) re-testing said circuit, and capturing input signals of said fanin cone;
- (c) processing information about said fanin cone to
  - (1) identify an error within said fanin cone, or
  - (2) identify a collection of input signals of said fanin code that potentially are at in error, and further identify said collection of input signals to be
    - (i) input signals of the circuit, or
    - (ii) internal signals of said circuit $S_{j,l}(k)$, with index l incremented by 1, that are output signal of memory elements of said circuit, each storing associated p logic values, and each having been subjected to an input signal $S_{j,l}(m-p)$;
- (d) setting m to m−p, thus forming signals $S_{j,l}(m)$, and with respect to each of the formed signals $S_{j,l}(m)$ returning to step (a); and
- (e) terminating said method when no input signals of any fanin code is identified as an output signal of a memory element of said circuit.

2. The method of claim 1 where said steps (b) and (c) are carried out for all of said signals $S_{j,l}(m)$.

3. The method of claim 2 where said step of terminating also terminates when the value of m−p for setting to m in step (d) is less than 1.

4. The method of claim 1 where p=1.

5. The method of claim 1 where said error that is present k operational clock periods following occurrence of said given condition is observable at clock k+1.

6. The method of claim 1 further comprising a step of examining said circuit to identify the value of k.

7. The method of claim 1 where said testing of the circuit is executed in a system that includes said circuit connected to other circuits.

8. The method of claim 7 where said testing constitutes an at speed functional test of said system.

9. The method of claim 1 where said step of terminating execution of said method also terminates when step (c) identifies an error within said fanin cone.

10. The method of claim 1 including step that, when step (c) identifies an error within said fanin cone, performs a focused test on said fanin cone to identify cause of said error.

11. The method of claim 1 where said circuit is an integrated circuit and said signals $S_j(k)$ are outputs of assertion-checking circuits that are either embedded in the integrated circuit or configured in a configurable portion of said integrated circuit.

12. The method of claim 11 where said configurable portion is in a wrapper associated with a block of said integrated circuit.

13. The method of claim 1 where said circuit is an integrated circuit and said signals $S_j(k)$ are outputs that are known to be erroneous through comparison with expected results.

14. The method of claim 1, executed for each of said signals $S_j(m)$.

15. The method of claim 14 where said processing is carried out for the respective fanin cones associated with all of the signals $S_j(m)$ effectively concurrently.

16. The method of claim 14 where said processing is carried out for the respective fanin cones associated with all of the signals $S_j(m)$ substantially sequentially.

17. The method of claim 1 where said step of processing comprises
- (i) simulating internal signals of the fanin cone, based on said input signals captured in step (b), and developing a simulated output signal of said fanin cone;
- (ii) determining whether said simulated output signal matches said signal $S_j(m)$;
- (iii) when said step (ii) of said step of processing determines that said simulated output signal of said fanin cone does not match $S_j(m)$, concluding that said fanin cone is faulty; and
- (iv) when said step (ii) of said step of processing determines that the simulated output signal matches said $S_j(m)$, concluding that the fanin cone operates properly, and extending one or more error paths from the output signal of the fanin cone toward the input signals of said fanin cone to identify thereby said collection of input signals.

18. The method of claim 17 where said extending said one or more error paths comprises steps of comparing the simulated internal signals of the fanin cone to signals developed for said fanin cone by use of a line justification algorithm that assumes an output signal of said fanin cone to be $\overline{S}_j(m)$.

19. The method of claim 1 where said capturing of input signals in step (b) is involves a scan-out operation.

20. A method for testing a circuit comprising the steps of:

at-speed testing of the circuit with a sequence of input signals;

stopping said at-speed testing when an error signal $S_{j,l}(k)$ is detected, where the index j distinguished different signals, subscript l designates a level, which at this step is 0, and k is a number of at-speed operational clock periods following a given condition when said error signal is detected; and starting with variable m=k, and setting signal $S_{j,l}(m)$ as a subject signal, executing an error localization process that
- (a) identifies an associated fanin cone of the subject signal, and input signals of said associated fanin cone;
- (b) re-tests said circuit by once applying said sequence of input signals, and capturing said input signals of the fanin cone at clock period m following said given condition;
- (c) from information regarding design of said circuit, and logic value of the subject signal, computes logic values of said input signals of said associated fanin cone, and analyzes the computed logic values to
  - (1) identify an error within said fanin cone, or
  - (2) identify a collection input signals of said fanin code that potentially are at in error, and further identify said collection of input signals to be
    - (i) input signals of the circuit, or
    - (ii) internal signals of said circuit, $S_{j,l}(k)$, with index l incremented by 1, that are output signals of flip-flops of said circuit that have been respectively subjected to input signal $S_{j,l}(m-1)$;
- (d) decrements m by 1, thus forming signal to $S_{j,l}(m)$ as a new subject signals, and with respect to each of the formed signals $S_{j,l}(m)$ returns to step (a); and
- (e) terminating said method when no input signals of any fanin code is identified as an output signal of a flip-flop of said circuit.

* * * * *